United States Patent
Petro et al.

(12)

(10) Patent No.: US 6,216,146 B1
(45) Date of Patent: *Apr. 10, 2001

(54) METHOD AND APPARATUS FOR AN N-NARY ADDER GATE

(75) Inventors: Anthony M. Petro; James S. Blomgren, both of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/150,829

(22) Filed: Sep. 10, 1998

Related U.S. Application Data

(60) Provisional application No. 60/069,250, filed on Dec. 11, 1997.

(51) Int. Cl.[7] .................................. G06F 7/50; G06F 7/00
(52) U.S. Cl. .............................................. 708/670; 708/493
(58) Field of Search ................................. 708/230, 232, 708/234, 494, 670, 700, 701, 702, 703, 704, 706, 710, 711, 712, 713, 714

(56) References Cited

U.S. PATENT DOCUMENTS

| | | | |
|---|---|---|---|
| 4,914,614 | * | 4/1990 | Yamakawa .......................... 708/493 |
| 5,467,298 | * | 11/1995 | Yoshida ............................... 708/493 |
| 5,499,203 | * | 3/1996 | Grundland .......................... 708/710 |
| 6,003,059 | * | 12/1999 | Bechade ............................. 708/714 |

* cited by examiner

Primary Examiner—Chuong Dinh Ngo
(74) Attorney, Agent, or Firm—Booth & Wright, L.L.P.; Matthew J. Booth

(57) ABSTRACT

The present invention discloses a method and apparatus for adding two 1-of-N addends to produce a 1-of-N sum. In the preferred embodiment, the addends and sum comprise 1-of-4 logic signals.

16 Claims, 4 Drawing Sheets

METHOD AND APPARATUS FOR AN N-NARY ADDER GATE

This application claims the benefits of the earlier filed U.S. provisional application Ser. No. 60/069250, filed Dec. 11, 1997, which is incorporated by reference for all purposes into this application.

BACKGROUND OF THE INVENTION

1. Field of the Invention

The present invention relates to digital computing, and more particularly to an apparatus and method for implementing an N-NARY adder gate.

2. Description of the Related Art

Traditional Binary Addition

In most computer systems, addition and subtraction of numbers is supported. In systems using traditional binary logic, the truth table for one-bit addition is set forth in Table 1.

TABLE 1

| A | B | A + B |
|---|---|-------|
| 0 | 0 | 0 |
| 0 | 1 | 1 |
| 1 | 0 | 1 |
| 1 | 1 | 0* |

In the last row of Table 1, a carry condition occurs. That is, the result is 0, but a carry into the next-higher-order bit position, corresponding to a decimal value of 2, has conceptually occurred.

In addition to single bits, the addition operation may be performed on multiple bits, including addition of two two-bit values. The truth table for such an operation is set forth in Table 2, where the first operand A is a two-bit value comprising bits $A_0$ and $A_1$. The second operand, B, is a two-bit value comprising bits $B_0$ and $B_1$.

TABLE 2

| $A_1$ | $A_0$ | $B_1$ | $B_0$ | A = Decimal Value | B = Decimal Value | A + B | A + B = Dec. Value |
|---|---|---|---|---|---|---|---|
| 0 | 0 | 0 | 0 | 0 | 0 | 00 | 0 |
| 0 | 0 | 0 | 1 | 0 | 1 | 01 | 1 |
| 0 | 0 | 1 | 0 | 0 | 2 | 10 | 2 |
| 0 | 0 | 1 | 1 | 0 | 3 | 11 | 3 |
| 0 | 1 | 0 | 0 | 1 | 0 | 01 | 1 |
| 0 | 1 | 0 | 1 | 1 | 1 | 10 | 2 |
| 0 | 1 | 1 | 0 | 1 | 2 | 11 | 3 |
| 0 | 1 | 1 | 1 | 1 | 3 | 00* | 0 |
| 1 | 0 | 0 | 0 | 2 | 0 | 10 | 2 |
| 1 | 0 | 0 | 1 | 2 | 1 | 11 | 3 |
| 1 | 0 | 1 | 0 | 2 | 2 | 00* | 0 |
| 1 | 0 | 1 | 1 | 2 | 3 | 01* | 1 |
| 1 | 1 | 0 | 0 | 3 | 0 | 11 | 3 |
| 1 | 1 | 0 | 1 | 3 | 1 | 00* | 0 |
| 1 | 1 | 1 | 0 | 3 | 2 | 01* | 1 |
| 1 | 1 | 1 | 1 | 3 | 3 | 10* | 2 |

Each output value in the "A+B" column of Table 2 indicated with an asterisk denotes a carry condition where a logical one has conceptually carried into the next-higher-order bit (the bit position corresponding to a decimal value of four).

N-NARY Logic

The N-NARY logic family supports a variety of signal encodings, including 1-of-4. The N-NARY logic family is described in a copending patent application, U.S. patent application Ser. No. 09/019,355, filed Feb. 5, 1998, now U.S. Pat. No. 6,066,965, and titled "Method and Apparatus for a N-NARY logic Circuit Using 1-of-4 Encoding", which is incorporated herein for all purposes and is hereinafter referred to as "The N-NARY Patent." In 1-of-4 encoding, four wires are used to indicate one of four possible values. In contrast, traditional static design uses two wires to indicate four values, as is demonstrated in Table 2. In Table 2, the $A_0$ and $A_1$ wires are used to indicate the four possible values for operand A: 00, 01, 10, and 11. The two B wires are similarly used to indicate the same four possible values for operand B. "Traditional" dual-rail dynamic logic also uses four wires to represent two bits, but two wires are always asserted. In contrast, N-NARY logic asserts only one wire. The benefits of N-NARY logic over dual-rail logic, which included reduced power requirements and reduced noise, are apparent from a reading of The N-NARY Patent. All signals in N-NARY logic, including 1-of-4, are of the 1-of-N form where N is any integer greater than one. A 1-of-4 signal requires four wires to encode four values (0–3 inclusive), or the equivalent of two bits of information. More than one wire will never be asserted for a 1-of-N signal. Similarly, N-NARY logic requires that a high voltage be 22 asserted for all values, even 0. As illustrated in this specification and more thoroughly discussed in the N-NARY Patent, a 1 of N signal is used to convey multiple values of information in an integrated circuit. The 1 of N signal can convey information to and from an N-NARY logic circuit where an N-NARY logic circuit comprises a shared logic tree circuit that evaluates one or more 1 of N input signals and produces a 1 of N output signal. A single 1 of N signal comprises a bundle of N wires routed together between different cells (or different logic circuits) within a semiconductor device. A 1 of N signal uses a 1 of N encoding to indicate multiple values of information conveyed by the bundle of wires of the 1 of N signal where at most one and only one wire of the bundle of wires of the 1 of N signal is true during an evaluation cycle. The present invention further provides that the bundle of N wires may comprise a number of wires from the following group: a bundle of 3 wires, a bundle of 4 wires, a bundle of 8 wires, or a bundle of N wires. Additionally, the present invention may comprise a not valid value where zero wires of the bundle of N wires is active. Further, the present invention provides that the 1 of N encoding on the bundle of N wires cooperatively operate to reduce the power consumption in the integrated circuit according to the number of wires in the bundle of N wires evaluating per bit of encoded information.

Any one N-NARY gate may comprise multiple inputs and/or outputs. In such a case, a variety of different N-NARY encodings may be employed. For instance, consider a gate that comprises two inputs and two outputs, where the inputs are a 1-of-4 signal and a 1-of-2 signal and the outputs comprise a 1-of-4 signal and a 1-of-3 signal. Various variables, including P, Q, R, and S, may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-NARY signals that comprise a variety of different encodings.

SUMMARY OF THE INVENTION

The present invention discloses a method and apparatus for adding two 1-of-N addends to produce a 1-of-N sum. In the preferred embodiment, the addends and sum comprise 1-of-4 logic signals.

DETAILED DESCRIPTION OF THE INVENTION

The present invention relates to an adder gate using N-NARY logic. This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail some well-known structures such as N-FETs, P-FETs, nor does it describe N-NARY logic in detail, in order not to obscure the present invention.

A truth table demonstrating the add operation using 1-of-4 encoding is set forth in Table 3. Each of the inputs A and B in Table 3 is a two-bit input that can represent one of four values, 0 through 3 inclusive, depending on which of the four wires for each signal is set high. Table 3 discards any potential input value that includes more than one wire asserted for each 1-of-4 signal, such as 1111 and 0101. Such values are undefined for the evaluate stage of 1-of-4 logic gates. The four wires for the two-bit sum of the 1-of-4 addition operation in Table 3 are labeled $S_3$, $S_2$, $S_1$, and $S_0$.

N-NARY Logic Circuits

Figure 1:
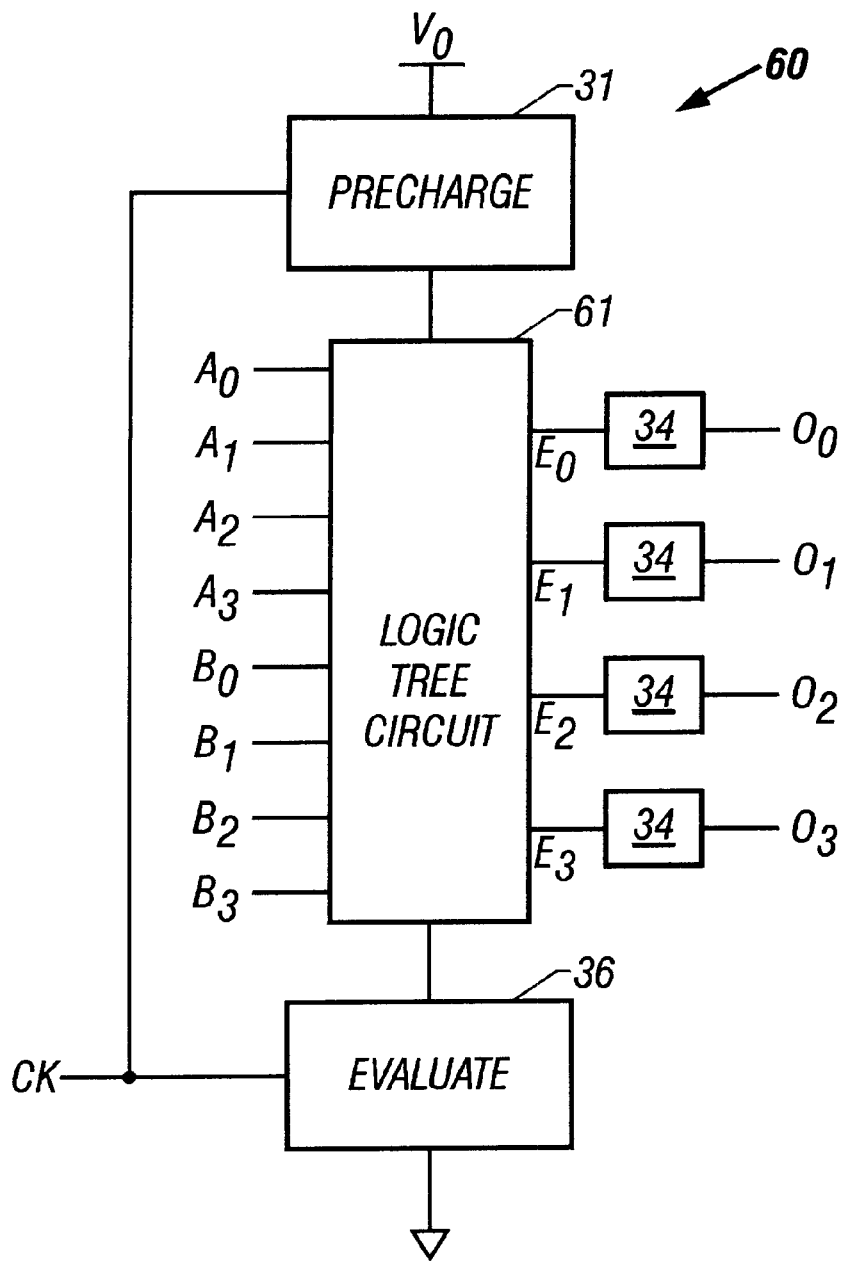
FIG. 1 is a block diagram of an N-NARY gate.

The present invention utilizes N-NARY logic. A background discussion of N-NARY circuits is in order before discussing the adder gate of the present invention. FIG. 1 illustrates a 1-of-N logic gate 60 that uses two sets of 1-of-N signals for the inputs and produces one 1-of-N signal for the output. In gate 60, the A and B inputs comprise four wires each, with each set of wires representing 2 bits (one dit) of data. A is a one-dit input, B is a one-dit input, and O is a one-dit output. In other words, the N-NARY gate 60 depicted in FIG. 1 comprises 4 input bits (2 dits) and 2 output bits (one dit).

Figure 2:
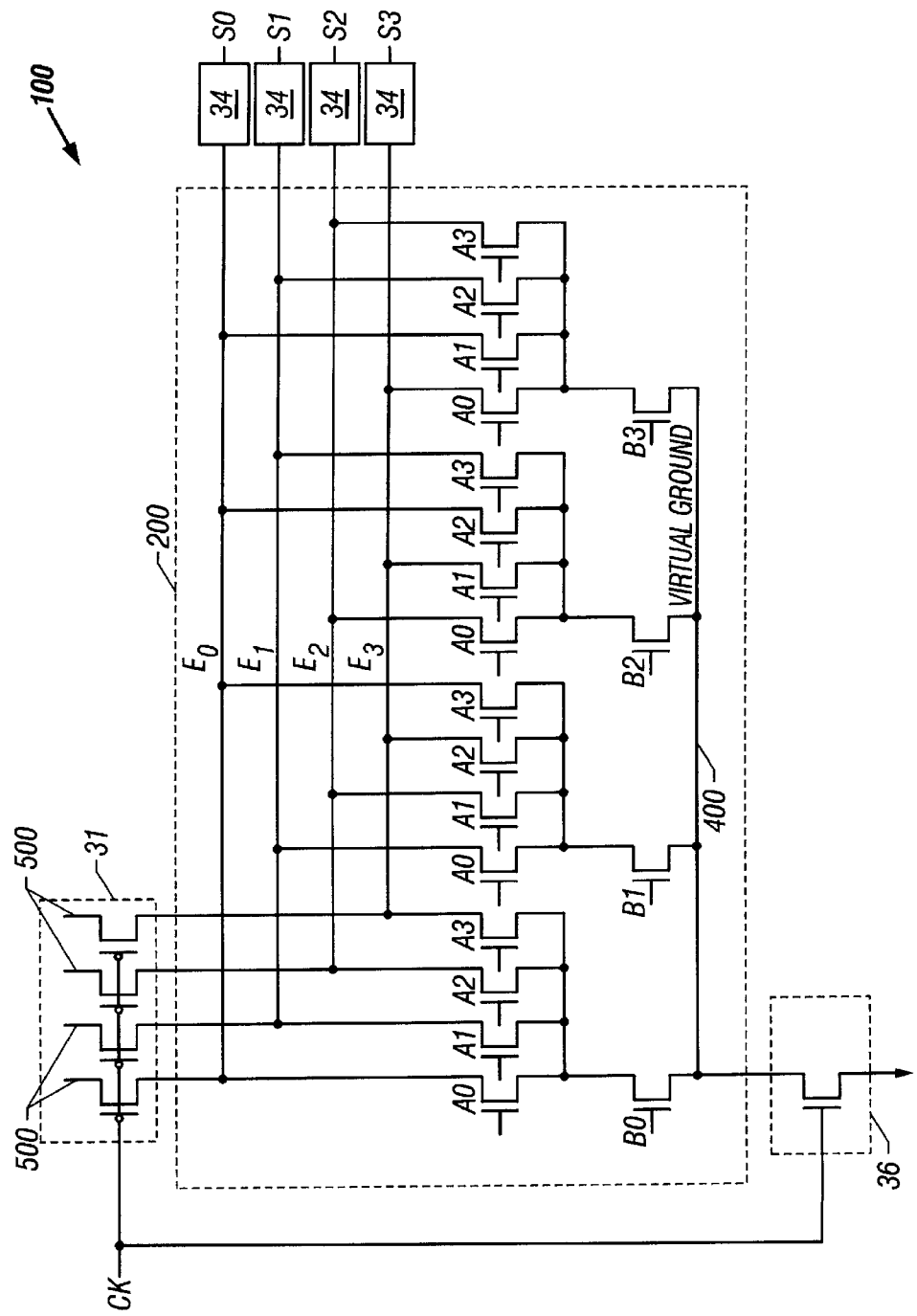
FIG. 2 is an illustration of an N-NARY adder gate.

Referring to FIG. 1, each N-NARY dit logic circuit 60 comprises a logic tree circuit 61, a precharge circuit 31, and an evaluate circuit 36. The logic tree circuit 61 performs a logic function on the two 1-of-4 input signals that could comprise a variety of functions, for example, the Boolean logic functions AND/NAND and OR/NOR, or the more complex add function of the present invention. The logic gates of the N-NARY family are clocked pre-charge (CP) gates. FIG. 2 illustrates that each input into the logic tree circuit 61 is coupled to at least one N-channel field effect transistor (NFET) $A_0$-$A_3$, $B_0$-$B_3$. Referring back to FIG. 1, the logic tree circuit 61 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34.

Referring again to FIG. 1, a precharge circuit 31 couples to the logic tree circuit 61 and precharges the dynamic logic of the logic tree circuit 61. The precharge circuit 31 comprises one or more FETs with the preferred embodiment of the circuit comprising P-channel FETs (PFETs). Each evaluation path of the logic tree circuit 61 has its own precharge PFET, shown as 500 in FIG. 2. The PFETs 500 of the precharge circuit 31 quickly and fully precharge all of the dynamic logic in the logic tree circuit 61 during the precharge phase of the clock cycle.

FIG. 2 is a diagram of an N-NARY adder gate. FIG. 2 illustrates that the precharge PFET 500 for an evaluation node E of an N-NARY circuit is connected to positive high voltage, Vcc, and is used to create conductive paths between

TABLE 3

| $A_3$ | $A_2$ | $A_1$ | $A_0$ | A Dec. Value | $B_3$ | $B_2$ | $B_1$ | $B_0$ | B Dec. Value | $S_3$ | $S_2$ | $S_1$ | $S_0$ | Output Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | 1 |
| 0 | 0 | 0 | 1 | 0 | 0 | 1 | 0 | 0 | 2 | 0 | 1 | 0 | 0 | 2 |
| 0 | 0 | 0 | 1 | 0 | 1 | 0 | 0 | 0 | 3 | 1 | 0 | 0 | 0 | 3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 1 | 0 | 0 | 2 |
| 0 | 0 | 1 | 0 | 1 | 0 | 1 | 0 | 0 | 2 | 1 | 0 | 0 | 0 | 3 |
| 0 | 0 | 1 | 0 | 1 | 1 | 0 | 0 | 0 | 3 | 0 | 0 | 0 | 1 | 0* |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 3 |
| 0 | 1 | 0 | 0 | 2 | 0 | 1 | 0 | 0 | 2 | 0 | 0 | 0 | 1 | 0* |
| 0 | 1 | 0 | 0 | 2 | 1 | 0 | 0 | 0 | 3 | 0 | 0 | 1 | 0 | 1* |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 0 | 0 | 1 | 0* |
| 1 | 0 | 0 | 0 | 3 | 0 | 1 | 0 | 0 | 2 | 0 | 0 | 1 | 0 | 1* |
| 1 | 0 | 0 | 0 | 3 | 1 | 0 | 0 | 0 | 3 | 0 | 1 | 0 | 0 | 2* |

In Table 3, output values with asterisks indicate that a carry is conceptually generated into a higher-order bit representing a decimal value of 4.

the evaluation node E and Vcc. Each precharge PFET 500 is coupled to an input, the pre-charge signal. When the pre-charge signal for any evaluate node has a low voltage, then there is a conductive path between Vcc and the evaluation node E. Coupled to the precharge circuit 31 is the clock signal CK. A low clock signal on CK will cause the FETs in the logic tree circuit 32 to charge when using P-channel FETs in the precharge circuit 31.

An evaluate circuit 36 couples to the logic tree circuit 61 and controls the evaluation of the logic tree circuit 61. The evaluate circuit 36 comprises one or more FETs connected to the CK signal, with the preferred embodiment of the evaluate circuit comprising a single N-channel FET. The single N-FET acts as an evaluation transistor that is used to control when the gate is sensitive to inputs, helps avoid races between other devices, and prevents excessive power consumption. During the precharge phase, the evaluate circuit 36 receives a low value so that no path to Vss may exist through the NFET(s) of the logic tree circuit 61. During the evaluate phase, the evaluate circuit 36 receives a high signal so that a path to Vss through the NFET(s) of the logic tree circuit 61 may exist. Coupled to the evaluate circuit 36 is the clock signal CK. A high clock signal on CK will cause the FETs in the logic tree circuit 61 to evaluate when using N-channel FETs in the evaluate circuit 36. In other words, when the clock signal is high, the evaluate circuit 36 evaluates the logic tree circuit 61.

Figure 3:
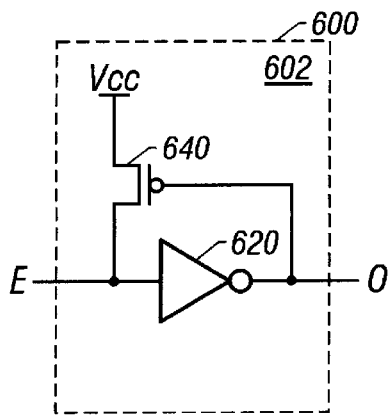
FIG. 3 is a diagram of a first embodiment of an N-NARY output driver circuit.
Figure 4:
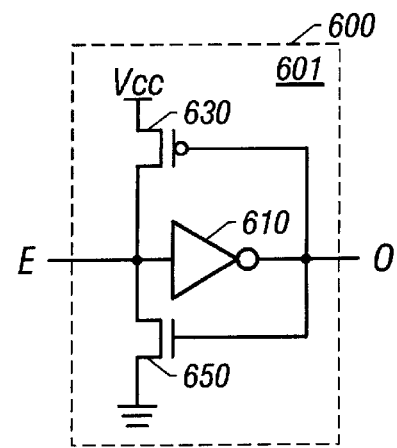
FIG. 4 is a diagram of a second embodiment of an N-NARY output driver circuit.

An evaluate node, E, which comprises the four wires $E_0$, $E_1$, $E_2$, and $E_3$, is the signal pathway between the logic tree circuit 61 and an output buffer 34, and constitutes an evaluation path of the logic tree circuit 61. As stated earlier, each evaluation node wire $E_0$, $E_1$, $E_2$, and $E_3$ has its own precharge PFET. The signal on a particular wire, $E_0$, $E_1$, $E_2$, $E_3$ of the evaluate node E is high, only when there is no connection to Vss through the logic tree circuit 61 NFET(s) associated with that particular wire. If the pre-charge signal is low at time 0, and there is no path to ground through the NFET(s) associated with an evaluate node E, of the logic tree circuit 61, then the evaluate node wire E gets pulled to a high voltage. This is called the precharge phase of the gate and we may also say that the gate is in precharge mode. If the precharge signal switches to a high voltage at a later time, the evaluate node E will be floating but the charge left on it will leave the voltage high. This is called the evaluate phase of the gate, and we may also say that the gate is in evaluate mode. If input signals generate a high voltage for any NFET(s) in the logic tree circuit 61 such that a path from the evaluate node E to ground (Vss) exists, then the charge on the evaluate node E will drain to ground, and the evaluate voltage will drop to Vss. If no such path exists, then the evaluate node E will remain at Vcc. When any gate, therefore, switches from precharge mode to evaluate mode, the evaluate node voltage is high, and it either stays high or goes low. Once the evaluate node voltage goes low during the evaluate phase, it cannot be driven high again until the next precharge phase. Each evaluate node wire $E_0$, $E_1$, $E_2$, and $E_3$ couples to an output buffer 34. Two embodiments of the output driver circuit 600 comprising the output buffer 34 are illustrated in FIGS. 3 and 4. FIG. 3 illustrates a half keeper circuit 602 that comprises an inverter 620 and a PFET device 640. FIG. 4 illustrates a full keeper circuit 601 that comprises an inverter 610 coupled to a PFET device 630 and an NFET device 650. Full keeper output driver circuits 601 are only necessary for gates that can be in neither evaluate nor precharge mode for lengthy periods. The flow through the output driver circuit 600 is from evaluate node E to the output signal path O. The inverter 610, 620 of the output driver circuit 600 is necessary because the evaluate nodes of CP gates of the N-NARY logic family precharge to a high value and evaluate to a low value. The output driver circuit 600 of output buffer 34, holds the value during an evaluate phase if the evaluate node E has not discharged. If the evaluate node E has discharged, then there is a path to ground holding its value low. The output of each evaluate node E will switch from low to high once, at most, during an evaluate phase. The output of each evaluate node E, once coupled to an output driver circuit 600 of output buffer 34, is therefore suitable for feeding a subsequent CP gate.

Figure 5:
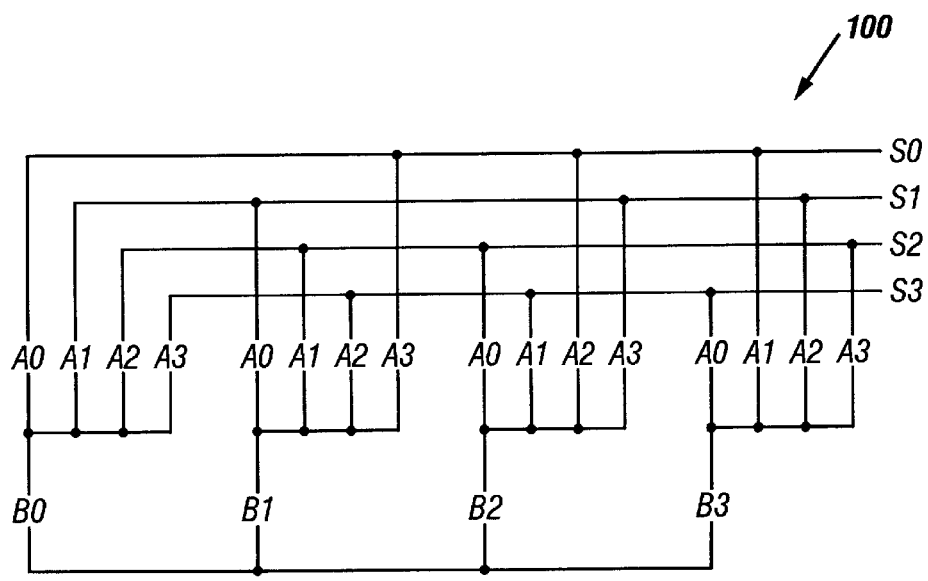
FIG. 5 is a shorthand representation of an N-NARY adder gate having two 1-of-4 addend inputs.
Figure 5A:
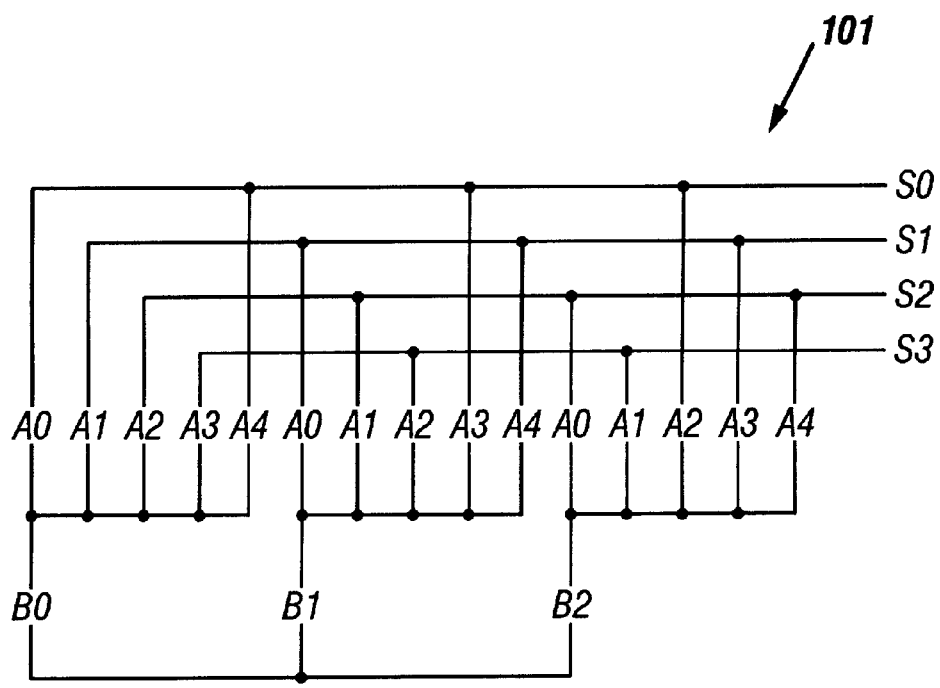
FIG. 5A is a shorthand representation of an N-NARY adder gate having a 1-of-3 addend input and a 1-of-5 addend input.

A shorthand notation for circuit diagrams can be adopted to avoid needless repetition of elements common to all N-NARY circuits. FIG. 2 illustrates these common elements. One common element is the precharge P-FET 500. Precharge P-FETs 500 are required for each evaluate node E in every 1-of-N gate since a single precharge PFET 500 would short each evaluate node E relative to the other evaluate nodes. Since all N-NARY gates require a pre-charge P-FET 500 for each evaluate node E, the pre-charge P-FETs 500 may be implied and need not be shown. The same is true for the N-FET associated with each input wire of the A and B inputs. Similarly, each evaluate node E must have its own output buffer 34, which may be implied. The N-FET associated with the evaluate node 36 may also be implied. Since these features are common to all N-NARY circuits, we may use the shorthand shown in FIG. 5 to represent the N-NARY circuits. Accordingly, FIG. 5 illustrates a shorthand notation of the adder gate depicted in FIG. 2. This shorthand notation is also used in FIG. 5A. In FIGS. 5 and 5A the elements discussed herein should be implied accordingly.

Figure 6:
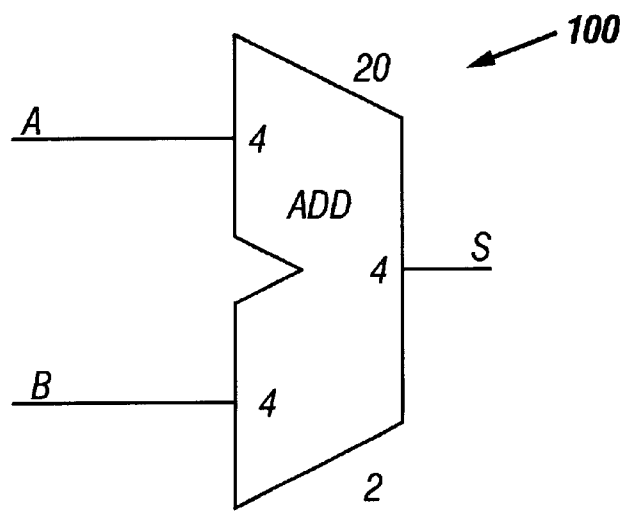
FIG. 6 is a high-level shorthand representation of an N-NARY adder gate.

A further simplification to the representation of the FIG. 2 adder is shown in FIG. 6, where the inputs and outputs are shown as single signals which each can represent one of four signals and each impliedly comprises four wires. The number "4" shown within the add gate of FIG. 6, adjacent to the connections, indicates that each signal can represent one of four values. The number above the gate indicates the number of transistors in the evaluate stack, and the number below the FIG. 6 gate represents the maximum number of transistors in series between the evaluate node and virtual ground. In FIG. 6, the elements discussed herein should be implied accordingly.

Basic N-NARY Adder Gate

FIG. 5 illustrates N-NARY adder gate 100 of the present invention. The adder gate 100 uses 1-of-4 logic to perform the addition function on two 1-of-4 inputs to generate a 1-of-4 output signal conforming to Table 3. The concepts discussed below may also be used in an adder gate 101 that performs the add function on 1-of-3 and/or 1-of-5 addends. Such a gate 101 is depicted in FIG. 5A. The function of the adder circuit 100 illustrated in FIG. 5 is to add two 1-of-4 inputs and produce the least significant two bits of the sum, which is also implemented as a 1-of-4 signal. Since the adder circuit 100 operates on two four-value signals it is not appropriate to refer to it as binary. The function of the adder gate 100 is quaternary, rather than binary.

The adder circuit 100 illustrated in FIG. 5 has an A input signal comprising four wires, $A_0$, $A_1$, $A_2$, and $A_3$, and a B input signal comprising four wires, $B_0$, $B_1$, $B_2$, and $B_3$. The A input signal and the B input signal can each represent any integer having a decimal value between zero and three, inclusive. Since N-NARY logic requires that only one of the four wires representing the A input be asserted at any one time, and only one of the B input wires be asserted at one time, it is convenient to treat the A and B signals as individual inputs that each can represent one of four values. The adder circuit 100 therefore has eight inputs: $A_0$, $A_1$, $A_2$, $A_3$, $B_0$, $B_1$, $B_2$, and $B_3$. If the value of A is zero, then the $A_0$ wire is set high and all other A wires, $A_1$, $A_2$, $A_3$, are set low.

By the same token, the $B_0$ wire corresponds to zero. Similarly, the $A_1$ wire and $B_1$ wire correspond to the decimal value of one. The $A_2$ wire and $B_2$ wire correspond to the decimal value of two. Finally, the $A_3$ wire and $B_3$ wire correspond to the decimal value of three. The adder circuit 100 illustrated in FIG. 5 performs the following logic functions:

$S_0 = B_0A_0|B_1A_3|B_2A_2|B_3A_1$ (all cases that equal 0 or 4),
$S_1 = B_0A_1|B_1A_0|B_2A_3|B_3A_2$ (all cases that equal 1 or 5),
$S_2 = B_0A_2|B_1A_1|B_2A_0|B_3A_3$ (all cases that equal 2 or 6), and
$S_3 = B_0A_3|B_1A_2|B_2A_1|B_3A_0$ (all cases that equal 3).

FIG. 5 illustrates that the S0 output is pulled high if the sum of the two addends A and B is zero or four. The S1 output is pulled high if the sum of A and B is one or five. The S2 output is pulled high if the sum of A and B is two or six. Finally, the S3 output is pulled high if the sum of A and B is three. Similar functionality may be achieved in gates 101 using 1-of-3 and 1-of-5 encoding. A shorthand drawing of an adder gate 101 having a 1-of-3 input and a 1-of-5 input is illustrated in FIG. 5A.

In sum, the preferred embodiment of the present invention is an N-NARY gate that adds two 1-of-4 addends to produce the least two significant bits of the sum as a 1-of-4 result.

Other embodiments of the invention will be apparent to those skilled in the art after considering this specification or practicing the disclosed invention. The specification and examples above are exemplary only, with the true scope of the invention being indicated by the following claims.

We claim:

1. An apparatus that adds two N-NARY addends that comprise 1 of N signals to produce an N-NARY sum that comprises a 1 of N signal, comprising:
   a 1-of-P first addend input coupled to receive the first addend wherein said 1 of P first addend input comprises a 1 of N signal where N is greater than 2;
   a 1-of-Q second addend input coupled to receive the second addend wherein said 1 of Q second addend input comprises a 1 of N signal where N is greater than 2; and
   an adder circuit that adds the addends to produce the sum, said adder circuit is coupled to said first addend input and to said second addend input, said adder circuit is further coupled to a 1-of-R sum output that is configured to deliver the sum where in said 1 of R sum output comprises a 1 of N signal where N is greater than 2.

2. The apparatus of claim 1 wherein said first addend input comprises a 1 of N signal where N=3, 4, or 5.

3. The apparatus of claim 1 wherein said second addend input comprises a 1 of N signal where N=3, 4, or 5.

4. The apparatus of claim 1 wherein said sum output comprises a 1 of N signal where N=4.

5. A system for adding two N-NARY addends that comprise 1 of N signals to produce an N-NARY sum that comprises a 1 of N signal, comprising:
   a 1-of-P first addend input coupled to receive the first addend wherein said 1 of P first addend input comprises a 1 of N signal where N is greater than 2;
   a 1-of-Q second addend input coupled to receive the second addend wherein said 1 of Q second addend input comprises a 1 of N signal where N is greater than 2;
   a 1-of-R sum output for delivering the sum wherein said 1 of R sum output comprises a 1 of N signal where N is greater than 2; and
   an adder means for adding the first addend and the second addend and for producing the sum, said adder means is coupled to said first addend input, said second addend input, and said sum output.

6. The system of claim 5 wherein said first addend input comprises a 1 of N signal where N=3, 4, or 5.

7. The system of claim 5 wherein said second addend input comprises a 1 of N signal where N=3, 4, or 5.

8. The system of claim 5 wherein said sum output comprises a 1 of N signal where N=4.

9. A method to manufacture an apparatus that adds two N-NARY addends that comprise 1 of N signals to produce an N-NARY sum that comprises a 1 of N signal, comprising:
   providing a 1-of-P first addend input that is coupled to receive the first addend wherein said 1 of P first addend input comprises a 1 of N signal where N is greater than 2;
   providing a 1-of-Q second addend input that is coupled to receive the second addend wherein said 1 of Q second addend input comprises a 1 of N signal where N is greater than 2;
   providing an adder circuit that adds the addends to produce the sum;
   coupling said adder circuit to said first addend input and said second addend input;
   providing a 1-of-R sum output that is configured to deliver the sum wherein said 1 of R sum output comprises a 1 of N signal where N is greater than 2; and
   coupling said adder circuit to said sum output.

10. The method of claim 9 wherein said first addend input comprises a 1 of N signal where N=3, 4, or 5.

11. The method of claim 9 wherein said second addend input comprises a 1 of N signal where N=3, 4, or 5.

12. The method of claim 9 wherein said sum output comprises a 1 of N signal where N=4.

13. A method for adding two N-NARY addends that comprise 1 of N signals to produce an N-NARY sum that comprises a 1 of N signal, comprising:
   receiving the 1-of-P first addend wherein said 1 of P first addend input comprises a 1 of N signal where N is greater than 2;
   receiving the 1-of-Q second addend wherein said 1 of Q second addend input comprises a 1 of N signal where N is greater than 2;
   adding the first addend and the second addend to produce the 1-of-R sum wherein said 1 of R sum comprises a 1 of N signal where N is greater than 2.

14. The method of claim 13 wherein said 1 of P first addend comprises a 1 of N signal where N=3, 4, or 5.

15. The method of claim 13 wherein said 1 of Q second addend comprises a 1 of N signal where N=3, 4, or 5.

16. The method of claim 13 wherein said 1 of R sum comprises a 1 of N signal where N=4.

* * * * *